United States Patent [19]

Kehler, Jr.

[11] Patent Number: 4,968,952

[45] Date of Patent: Nov. 6, 1990

[54] VOLTAGE CONTROL OSCILLATOR WITH AUTOMATIC CURRENT CONTROL

[75] Inventor: Walter H. Kehler, Jr., Sunrise, Fla.

[73] Assignee: Motorola, Inc., Schaumburg, Ill.

[21] Appl. No.: 360,627

[22] Filed: Jun. 2, 1989

[51] Int. Cl.⁵ .............................................. H03L 7/00
[52] U.S. Cl. .................................. 331/11; 331/108 R
[58] Field of Search ............ 331/8, 11, 16, 25, 108 R, 331/108 D

[56] References Cited

U.S. PATENT DOCUMENTS 3,886,485  5/1975  Takahashi .................. 331/108 D X Primary Examiner—Robert J. Pascal
Attorney, Agent, or Firm—Michael J. Buchenhorner

[57] ABSTRACT

An automatic voltage-controlled oscillator (VCO) current control circuit, that senses a voltage in the VCO representative of the current of the VCO, compares that voltage to a reference voltage, and applies the voltage resulting from that comparison back to the VCO at a point therein that changes its bias state in such a manner as to maintain the noise level in the VCO at a minimum and also maintains the power output of the oscillator substantially constant.

10 Claims, 2 Drawing Sheets

VOLTAGE CONTROL OSCILLATOR WITH AUTOMATIC CURRENT CONTROL

TECHNICAL FIELD

This invention relates generally to control circuitry for controlling the oscillator current in a voltage-controlled oscillator (VCO).

BACKGROUND ART

Known circuits for controlling VCOs use feedback circuits that sense the power output of the VCO and rectify that power for controlling the gain of the VCO. However, sensing radio-frequency power is inadequate if one seeks to maintain noise at a minimum.

SUMMARY OF THE INVENTION

Accordingly, it is an object of the present invention to provide a control circuit that senses a direct current (DC) signal that is indicative of the oscillation current or that senses an alternating current (AC) signal indicative of the VCO bias state and filters out the AC before the feedback signal is produced. It is another object of the invention to provide an oscillator current control circuit that maintains a minimum noise level throughout a broad spectrum of frequencies while maintaining the power output substantially constant.

Briefly, according to the invention, the oscillator bias voltage of a VCO is controlled in such a manner as to maintain a constant oscillation current output. A comparator is used to compare a DC voltage, sensed at a point in the VCO wherein the current of the VCO may be determined, with a reference voltage that is indicative of the desired level of the oscillator current. The output of the comparator is applied back to the VCO so that the oscillator bias voltage is changed to maintain the oscillation current costant.

The voltage sensed in the VCO may be AC as long as a low pass filter is provided between the sensing point and the comparator to filter out the AC component of the sensed voltage.

DETAILED DESCRIPTION OF THE PREFERRED EMBODIMENT

Figure 1:
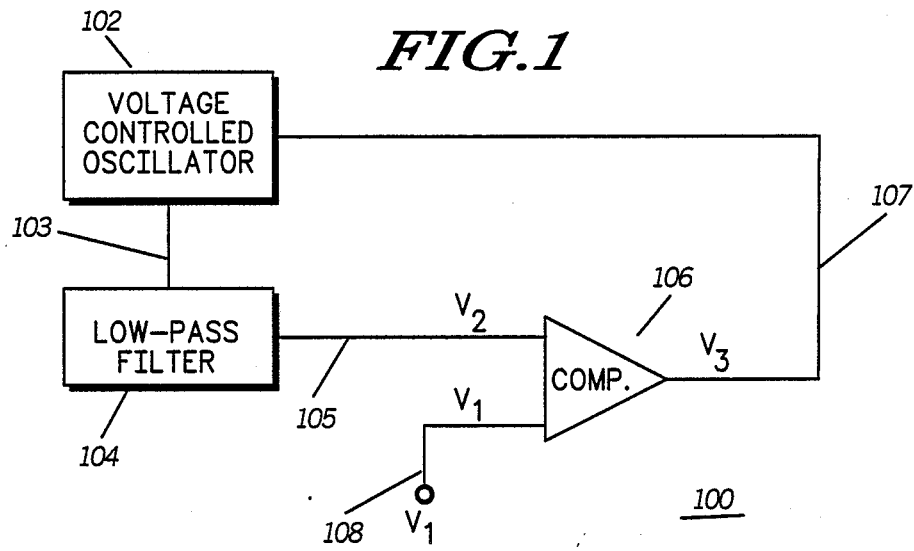
FIG. 1 is a block diagram of an automatic current control circuit in accordance with the invention.

Referring to FIG. 1, a block diagram of an automatic current control circuit 100 in accordance with the invention is shown. A voltage is sensed, in a voltage-controlled oscillator (VCO), that represents the oscillation current state of the oscillator. That voltage is then applied to a low-pass filter 104, by a line 103, for filtering out of the alternating-current (AC) component of the sensed voltage. The output (V2) of the low-pass filter is applied to a first input 105 of a comparator 106 for comparing with a reference voltage (V1). The output (V3) of the comparator 106 is applied back to the VCO by a line 107 to control the oscillator bias voltage.

Figure 2:
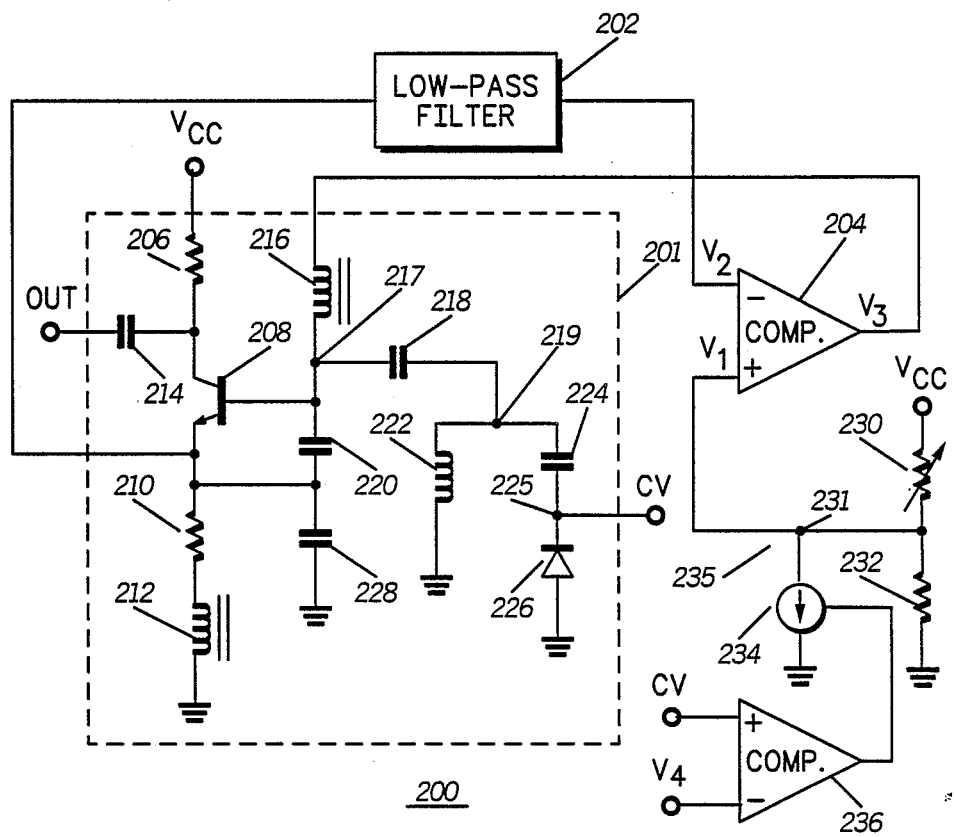
FIG. 2 is a schematic of an embodiment of the automatic current control circuit with an emitter sensing point for the feedback loop including a current cut-back circuit.

Referring to FIG. 2, an embodiment of the automatic current control circuit 200 is shown. A VCO 201 comprises a bipolar oscillator transistor 208 with its base coupled to a node 217, its collector coupled to the supply voltage (Vcc) (through a resistor 206), and its emitter coupled to ground through a resistor 210 and through a high frequency choke 212.) The emitter is also coupled to a terminal of capacitors 220 and a terminal of capacitor 228 at a node 209.

A choke 216 has a terminal coupled with a terminal of a capacitor 220 and a terminal of a capacitor 218 at node 217. The other terminal of capacitor 228 is coupled to ground and the other terminal of capacitor 218 is coupled to a node 219. An inductor 222 is disposed between ground and the node 219. A capacitor 224 is disposed between the node 219 and a node 225. A varactor diode 226 has its cathode coupled to the node 225 and its anode coupled to ground. A control voltage (CV) is applied at node 225 to control the frequency of the VCO 201.

A voltage that represents the current state of the VCO 201, is sensed at the emitter 209 of transistor 208 and applied to a low-pass filter 202. The output (V2) of the low-pass filter 202 is applied to a first (negative) input of a comparator 204 for comparison with a reference voltage (V1) present at the positive input of the comparator 204. The output (V3) of the comparator 204 is applied to the base of the oscillation transistor 208, through the choke 216, thus changing the voltage at node 217, as a function of the difference between voltages V1 and V2. Thus, the oscillator current is kept constant by comparing voltage V1 (which is adjusted by the user) with voltage V2 (the DC voltage developed by current flowing in the oscillator) and automatically adjusting the voltage V3 (which is also the base bias voltage of the VCO 201).

A current cut-back circuit 235 comprises a comparator 236 with inputs V4 and CV (the control voltage) and a current source 234 that is controlled by the output of the comparator 236. The current source 234 is disposed between node 231 and ground. The current cut-back circuit 235 operates only when the varactor control voltage, CV, is greater than voltage V4. When CV is less than V4 the current flowing through current-source 234 is zero and thus V1 is not altered. When CV is greater than V4, the current begins to flow through current-source 234, lowering the voltage V1 at node 231 and consequently lowering V3. A lower V3, in turn, results in a lower oscillator current.

The reference voltage V1 is selected in an adjustable circuit comprising an adjustable resistor, or potentiometer 230, disposed between the voltage supply (Vcc) and a node 231, and a resistor 232 disposed between node 231 and ground.

As the reverse bias on the varactor diode 226 increases, the VCO frequency increases and the quality factor of the varactor diode 226 also increases. Thus the VCO requires less current for optimum phase noise performance and power output. Thus, the addition of the current cut-back circuit 235 decreases the VCO current as CV rises.

Figure 3:
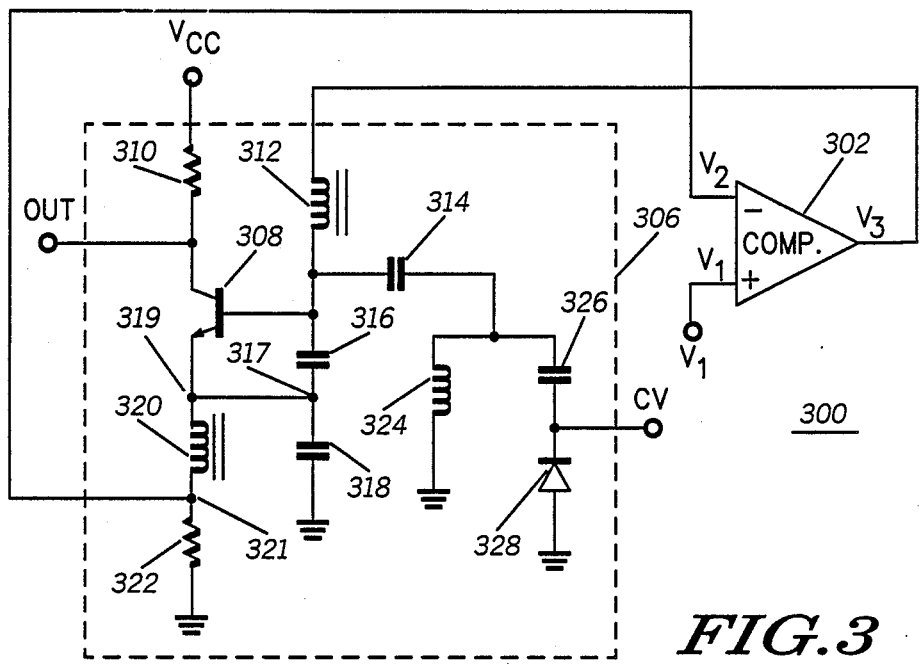
FIG. 3 is a schematic of another embodiment of the automatic current control circuit with an emitter DC sensing point for the feedback loop wherein no low pass filter is needed.

Referring to FIG. 3, another embodiment 300 of the invention is shown wherein the feedback voltage of the VCO 306 is sensed at a DC point in the VCO 306. The circuit configuration of VCO circuit 300 differs from that of the VCO circuit 200 described in reference to FIG. 2 only in three respects: (1) VCO circuit 300 does not include the current cut-back circuit 235 of VCO circuit 200; (2) VCO circuit 300 does not include the low-pass filter 202 of VCO circuit 200; and (3) the feedback volage of VCO circuit 300 is sensed at a DC node 321 because of the position of choke 320 which filters out the AC current flowing from the collector of transistor 308 to its emitter. The necessity for a low-pass filter is also eliminated by sensing the feedback voltage at DC point 321. In all other respects the VCO circuit 300 operates in the same way as VCO circuit 200.

Figure 4:
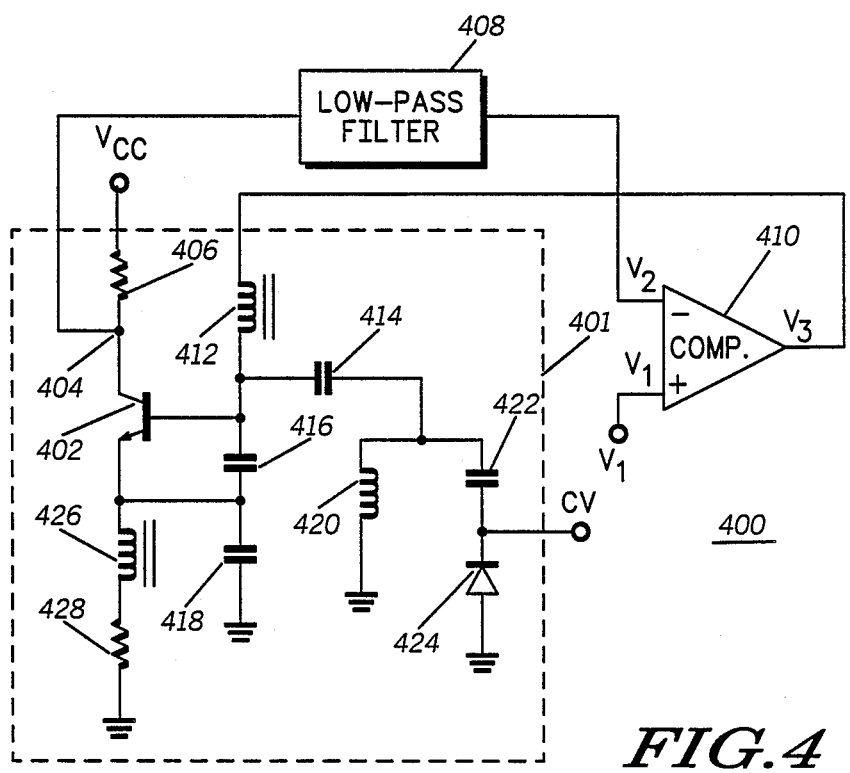
FIG. 4 is a schematic of another embodiment of the automatic current control circuit with a collector sensing point for the feedback loop.

Referring to FIG. 4, a further embodiment of the invention is shown. A VCO circuit 400 includes a feedback loop that senses an AC voltage at a node 404 at the collector of transistor 402. The VCO circuit 400 operates in substantially the way as the VCO circuit 200 described with respect to FIG. 2, and its operation only differs in that there is no current cut-back circuit included in VCO circuit 400 and that the sensing point for the feedback voltage is at the collector of the oscillation transistor 402 instead of at its emitter.

What is claimed is:

1. A circuit for controlling oscillation current in an oscillator comprising:
    a comparator for comparing a level of sensed voltage, that is representative of the oscillation current state of said oscillator, with a first reference voltage;
    means for providing said first reference voltage for comparison with said sensed voltage;
    said comparator providing an output that is coupled to said oscillator so that the oscillator current is maintained at an optimum level for minimizing the phase noise and substantially levelling the power of said oscillator.

2. The circuit of claim 1, wherein said sensed voltage is direct-current (DC) voltage.

3. The circuit of claim 1, further comprising a low-pass filter disposed between said oscillator and said comparator for filtering out alternating-current (AC) components of said sensed voltage.

4. The circuit of claim 1, wherein said oscillator comprises a bipolar oscillation transistor.

5. The circuit of claim 1, further comprising a means for reducing said first reference voltage when a control voltage, that is used to control the frequency at which said oscillator oscillates, is greater than a second reference voltage selected to compensate for any changes in the equivalent positive resistance of said oscillator as a result of maintaining the noise level of said oscillator at a minimum.

6. The circuit of claim 5, wherein the means for reducing said first reference voltage comprises a comparator for comparing said second reference voltage to said control voltage, said comparator being coupled to said means for providing said first reference voltage.

7. The circuit of claim 4, wherein said sensed voltage is sensed at a node coupled to the emitter of said oscillation transistor.

8. The circuit of claim 4, wherein said sensed voltage is sensed at a node coupled to the collector of said oscillation transistor.

9. The circuit of claim 4, further comprising a radio-frequency choke having first and second terminals, said first terminal being coupled to the emitter of said oscillation transistor and wherein said sensed voltage is sensed at a node coupled to said second terminal.

10. A method for controlling the oscillation current of an oscillator comprising:
    sensing a level of sensed voltage in said oscillator, said sensed voltage representing the oscillation current state of said oscillator;
    comparing said level of sensed voltage with a level of reference voltage to obtain a differential voltage that is proportion to the difference between said level of sensed voltage and said level of reference voltage; and
    applying said differential voltage to a point in said oscillator that controls its bias so that the noise level in said oscillator is maintained at a minimum level and the power output of said oscillator is maintained at a substantially constant level.

* * * * *

UNITED STATES PATENT AND TRADEMARK OFFICE
CERTIFICATE OF CORRECTION

PATENT NO. : 4,968,952

DATED : 11-6-90

INVENTOR(S) : Kehler, Jr.

It is certified that error appears in the above-identified patent and that said Letters Patent is hereby corrected as shown below:

In column 4, line 34, delete "proportion" and insert --proportional--.

Signed and Sealed this

Seventh Day of April, 1992

Attest:

HARRY F. MANBECK, JR.

*Attesting Officer*      *Commissioner of Patents and Trademarks*